US006791438B2

(12) United States Patent
Takahashi et al.

(10) Patent No.: US 6,791,438 B2
(45) Date of Patent: Sep. 14, 2004

(54) RADIO FREQUENCY MODULE AND METHOD FOR MANUFACTURING THE SAME

(75) Inventors: Kazuaki Takahashi, Tokyo (JP); Suguru Fujita, Tokyo (JP); Hiroshi Ogura, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 64 days.

(21) Appl. No.: 10/282,696

(22) Filed: Oct. 28, 2002

(65) Prior Publication Data

US 2003/0107459 A1 Jun. 12, 2003

(30) Foreign Application Priority Data

Oct. 30, 2001 (JP) ........................................ 2001-332219
Oct. 17, 2002 (JP) ........................................ 2002-302946

(51) Int. Cl.[7] ............................ H01P 1/208; H01P 3/123
(52) U.S. Cl. ......................... 333/208; 333/212; 333/250
(58) Field of Search ................................ 333/202, 208, 333/212, 230, 239, 250

(56) References Cited

U.S. PATENT DOCUMENTS 3,292,115 A * 12/1966 La Rosa ...................... 333/208
3,613,034 A * 10/1971 Linnd et al. ................. 333/208
3,680,012 A *  7/1972 Moreau ....................... 333/212
4,216,448 A *  8/1980 Kasuga et al. ............... 333/203
4,677,402 A *  6/1987 Cesani et al. ................ 333/203
5,739,733 A *  4/1998 Cameron ...................... 333/202
5,821,836 A * 10/1998 Katehi et al. ................ 333/202
6,191,670 B1 *  2/2001 Nguyen ....................... 333/208
6,523,248 B1 *  2/2003 Snygg et al. .................. 29/600

FOREIGN PATENT DOCUMENTS

JP            3-77402          4/1991

OTHER PUBLICATIONS

H. Uchimura et al. "A Ceramic Planar 77GHz Antenna Array", 1999 IEEE MTT–S International Microwave Symposium Digest, pp. 453–456, Jun. 13–19, 1999.

* cited by examiner

Primary Examiner—Barbara Summons
(74) Attorney, Agent, or Firm—RatnerPrestia

(57) ABSTRACT

A rectangular penetration hole is formed opening in the opposite two main surfaces of a first dielectric substrate. Conductors for grounding are respectively formed on the main surfaces, to cover the openings of the penetration hole. A conductor layer is formed on opposite inner walls in the penetration hole of the dielectric substrate. A waveguide is structured by a space surrounded by the conductors and the conductor layers. The waveguide is magnetically coupled with an input/output line on a second dielectric substrate through a coupling slot. Because a waveguide has walls made continuous in the dielectric substrate, a low-loss waveguide can be realized. Hence, a high-performance radio frequency module can be realized.

9 Claims, 18 Drawing Sheets

RADIO FREQUENCY MODULE AND METHOD FOR MANUFACTURING THE SAME

FIELD OF THE INVENTION

The present invention relates to a radio frequency module on which a radio frequency semiconductor integrated circuit is to be mounted for use in radio communications, and to a method for manufacturing such a radio frequency module.

BACKGROUND OF THE INVENTION

There is conventionally known a radio frequency module forming a waveguide in a multi-layer substrate, as described in 1999 IEEE MTT-S Microwave International Symposium Digest, pp. 453–456. In this structure, conductors are provided on the both surfaces of a multi-layered dielectric substrate. An air gap, constituting a waveguide, is formed in the dielectric substrate to provide through-holes in wall regions of the air gap. Meanwhile, conductors are provided between the layers of the dielectric substrate, to form waveguide walls in a lattice form using the through-holes and conductors. The air gap in the dielectric substrate serves as a waveguide defined by the upper and lower conductors and the lattice-formed walls, allowing a radio frequency to propagate.

In this radio frequency module, the waveguide on-wall conductor is formed in a lattice by the through-holes and the conductors. In a basic propagation mode TE10 of the waveguide, a current flows parallel with a traveling direction of a radio wave relative to the waveguide wall, raising a problem that conductor loss is increased by a discontinuity resulting from a lattice-formed structure of the wall conductor. With respect to this problem, such loss can be reduced by providing through-holes sufficiently short relative to the wavelength or by increasing the number of layers in the multi-layer substrate. In a millimeter-wave band, however, the wavelength in a free space ranges from 10 millimeters to 1 millimeter. Consequently, the discontinuity on the wall surface is not negligible relative to the wavelength, and hence loss inevitably increases. In particular, because the wavelength in a dielectric substrate is inversely proportional to a square root of an effective relative dielectric constant, the effect increases furthermore.

Meanwhile, the conventional rectangular waveguide is manufactured by metalworking. This, however, incurs a problem to increase material cost and time required in working.

SUMMARY OF THE INVENTION

The present invention is to solve the foregoing problem, and it is an object to provide a radio frequency module having a waveguide circuit which is reduced in loss of a radio frequency current flowing through a wall surface thereof, excellent in connectability to other circuits and low in cost but high in performance.

It is another object of the present invention to provide a manufacturing method thereof.

A radio frequency module of the present invention comprises: a dielectric substrate having first and second main surfaces and a rectangular penetration hole opening in the first and second main surfaces; first and second conductors for grounding respectively provided on the first and second main surfaces to cover the openings of the penetration hole; and a conductor layer formed on opposite inner wall surfaces in the penetration hole of the dielectric substrate; whereby a waveguide structure is configured by the first and second conductors and the conductor layers.

According to the radio frequency module, by structuring a wall surface of the waveguide using dielectric with a continuous conductor material surrounding the same, it is possible to reduce the loss of a radio frequency current flowing through the wall surface. The dielectric substrate itself, in a planar structure, is excellent in connectability to other circuits. In forming a wall-surface conductor, there is no need to form through-holes or making a substrate with layers. It is accordingly possible to realize a radio frequency module having a waveguide circuit that is low in cost but high in performance.

Meanwhile, the method for manufacturing a radio frequency module comprising the steps of: forming, by laser forming, a penetration hole having a plurality of rectangular portions coupled one with another in a first dielectric substrate formed, on a first main surface, with a conductor to reach the conductor; forming a metal film on an inner wall surface of the penetration hole; and joining a second dielectric substrate forming a conductor on one surface and an input/output line on the other surface, at the conductor surface, onto the other surface of the first dielectric substrate forming the metal film through a conductive double-sided adhesive sheet worked with a blank hole in a form of the penetration hole.

According to the manufacturing method, it is possible to realize, in a waveguide structure formed in a dielectric substrate, a continuous wall-surface structure for reducing conductor loss by a general working process at low cost and on a mass-production basis.

DESCRIPTION OF THE EXEMPLARY EMBODIMENT

Exemplary embodiments of the present invention are demonstrated hereinafter with reference to the accompanying drawings.

1. First Exemplary Embodiment

Figure 1:
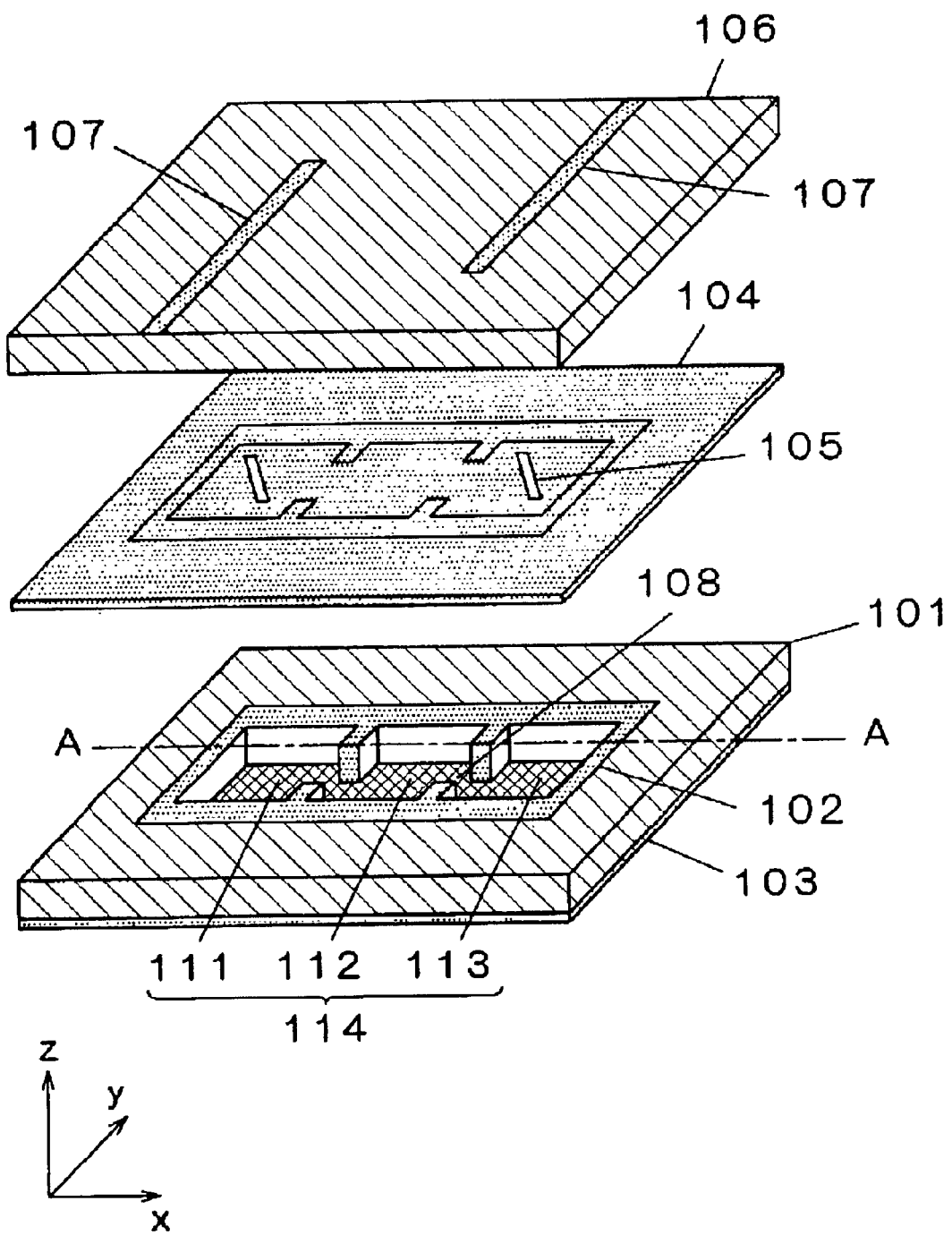
FIG. 1 is an exploded perspective view showing a radio frequency module structure according to Embodiment 1 of the present invention.
Figure 2:
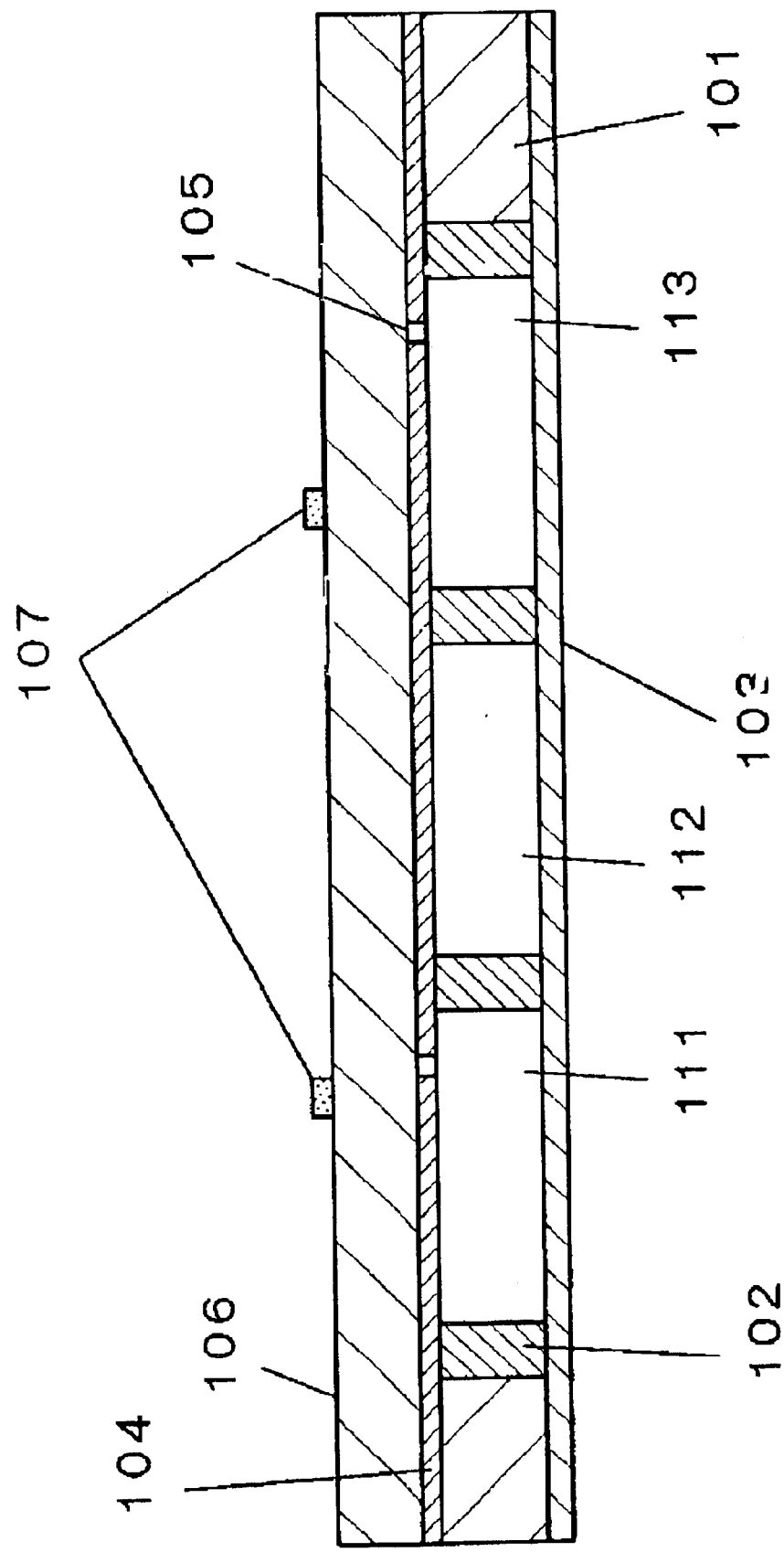
FIG. 2 is a sectional view taken on line A—A in a radio frequency module of FIG. 1.

FIG. 1 shows a three-dimensional structure in a first embodiment of a radio frequency module according to the present invention. FIG. 2 is a sectional view taken along line A—A of the radio frequency module of FIG. 1 in a state the elements are bonded together. In FIGS. 1 and 2, a dielectric substrate 101 has two main surfaces. A conductor plate 103, for grounding, is formed on one of the main surfaces. A penetration hole 114 nearly in a rectangular form is provided in a central region of the dielectric substrate 101, which opens in the main surfaces and reaches nearly the rectangular conductor plate 103. The penetration hole 114 has rectangular hole portions 111, 112, 113 juxtaposed at a constant interval. Furthermore, the partition walls, at between the hole portions 111 and 112 and between the hole portions 112 and 113, are cut out in a manner coupling them together, providing a structure formed with coupling windows 108. A conductor layer 102 is formed on a wall of the penetration hole 114. The penetration hole 114 can be easily formed by irradiating a laser beam through a metal mask having a window substantially in the same form as the shape thereof, to thereby remove away a region corresponding to the window.

A conductor plate 104 is further formed on the dielectric substrate 101. The conductor plate 104 is partly removed in areas corresponding to the rectangular hole portions 111 and 113, forming coupling slots 105 for coupling to a waveguide. A second dielectric substrate 106 has, on one main surface, input/output lines 107 formed in areas corresponding to the coupling slots 105.

The conductor layer 102 is formed by carrying out plating and forming a conductor film onto the penetration hole 114. The conductor plate 104, the dielectric substrate 106 and the input/output lines 107 can be easily formed by the use of a usual multi-layer lamination process. Meanwhile, the dielectric substrate 101 and the conductor plate 104 can be easily integrated together by bonding them through a conductive double-sided adhesion sheet.

In this embodiment, laser working is made to excavate a penetration hole 114 in order to form a conductor layer 102. In the other working, a usual multi-layer lamination process can be applied to form a waveguide. Hence, the embodiment is excellent in mass producibility, facilitating working to a complicated form.

In a TE10 mode as a waveguide basic propagation mode, a propagation frequency is determined by a width (y-axis direction) of a propagation path relative to a traveling direction (x-axis direction) of a wave. Because a propagation frequency is determined only by a width of various waveguide dimensions, the propagation frequency is not especially affected by in a height (z-axis direction) direction of the propagation path. For example, concerning a waveguide under the WR-15 standard for propagation at 50 Hz to 75 Hz, waveguide dimensions are given as 3.8 mm width by 1.9 mm height. However, propagation is available with waveguide dimensions in a height of smaller than 1.9 mm.

However, when a radio wave propagates, a current flows with a concentration on a wall surface. Hence, a current density increases with decrease in a thickness, resulting in an increased conductor loss. For this reason, loss further increases in case a flatness or continuity is hindered over the wall surface. This embodiment forms a conductor layer 102 in a continuous form to provide a continuous conductor wall surface similarly to that of a metal-worked waveguide, thus having a feature of lessened characteristic of deterioration resulting from conductor loss. Furthermore, a small-sized waveguide is realized because the wavelength is shortened with the waveguide by a relative dielectric constant of a dielectric used as a substrate material.

This embodiment shows a method to structure a bandpass filter as an example of a waveguide circuit. A resonator is formed by three rectangular hole portions 111, 112, 113 surrounded by the conductor layer 102. The stages are coupled through the coupling windows 108, showing a three-staged filter. Input/output coupling is realized by providing coupling slots 105 in the conductor plate 104. The coupling slots 105 can be easily realized by etching.

Furthermore, the input/output lines 107 formed on a second dielectric substrate 106 are of a microstrip line structure with the conductor plate 104. By arranging these respectively above the coupling slots 105, coupling to the resonator is obtained by electromagnetic coupling. Because the input/output lines 107 is made as a microstrip line structure as generally used on a radio frequency circuit, connection is easy to other radio frequency circuits.

Incidentally, in this embodiment, the penetration hole 114 for forming a conductor layer 102 was formed by the laser working. However, it is needless to say that another method, such as etching or milling, is also applicable.

The present Embodiment 1, because realizing a continuous wall-surface structure to reduce conductor loss, provides an operation that a low-loss waveguide circuit can be realized in a dielectric substrate.

In addition, dielectric loss is absent because of radio-wave propagation in air of a relative dielectric constant 1, thus realizing loss reduction.

2. Second Exemplary Embodiment

Figure 3:
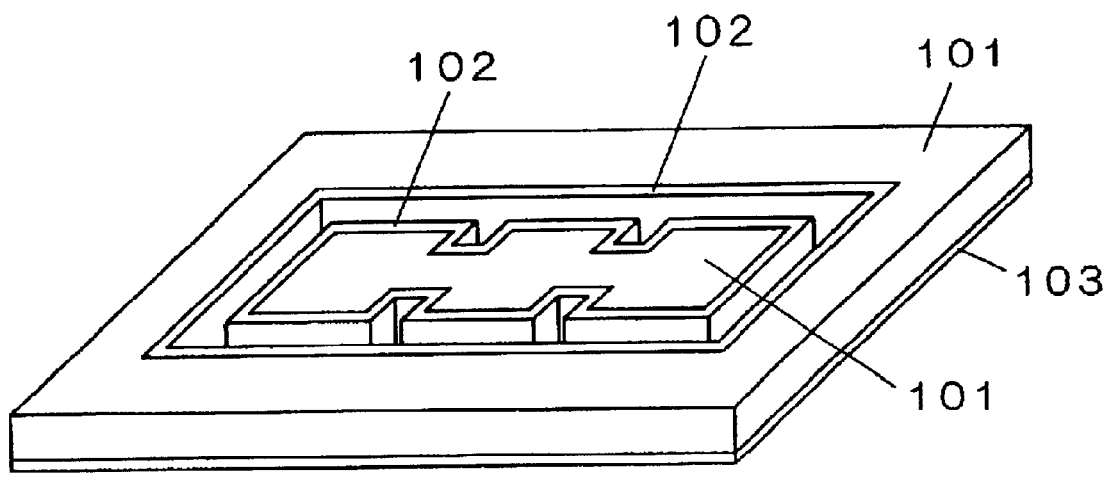
FIG. 3 is a perspective view of an essential part of a radio frequency module according to Embodiment 2 of the invention.
Figure 4:
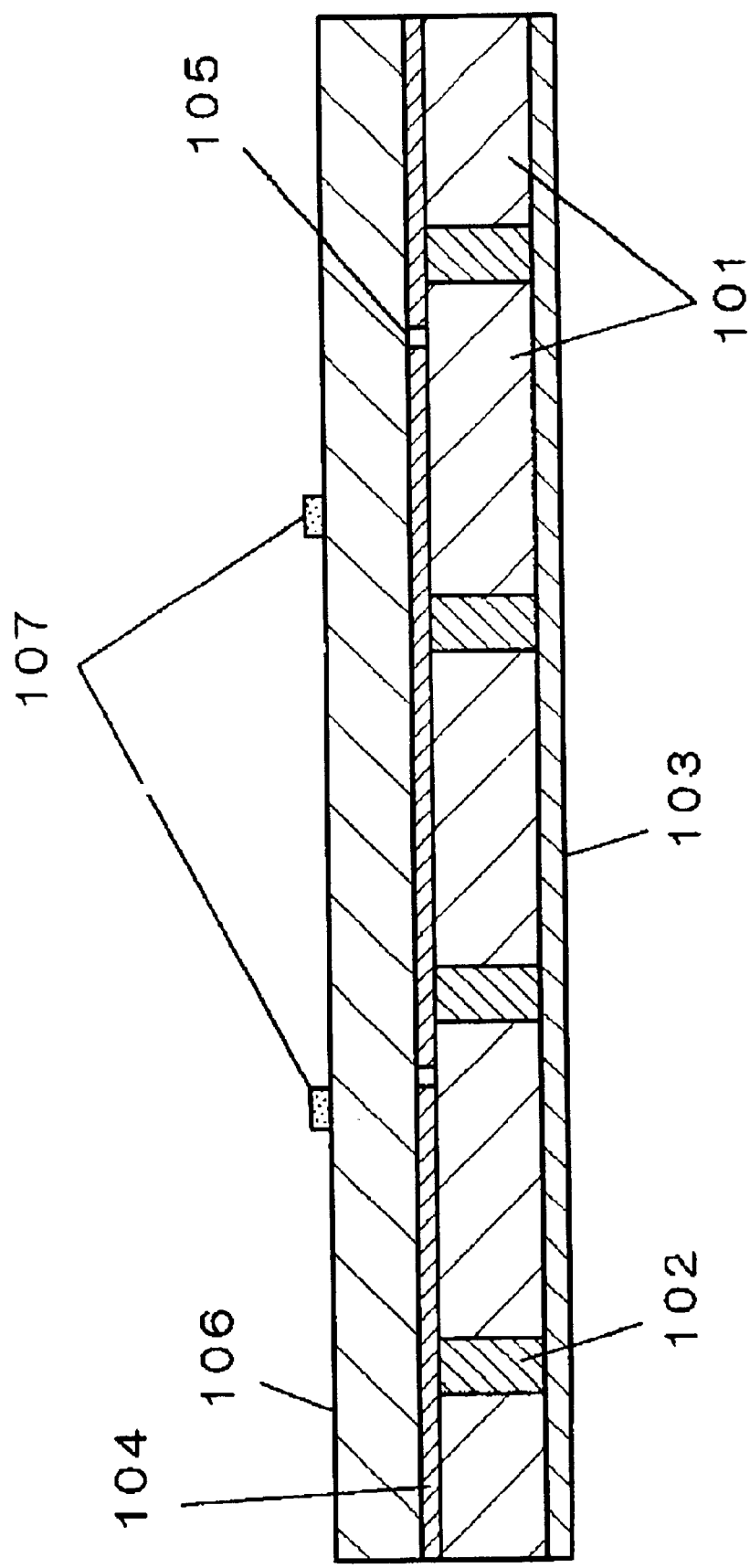
FIG. 4 is a sectional view of an essential part of the radio frequency module shown in FIG. 2.

FIG. 3 is a perspective view of a dielectric substrate and its conductor part at a lower side thereof in a second embodiment of a radio frequency module according to the invention, which corresponds to the lowermost part in the exploded perspective view of FIG. 1. FIG. 4 is a sectional view of the radio frequency module in the second embodiment, which corresponds to a sectional view of the corresponding part of FIG. 2. In FIGS. 3 and 4, the difference from FIGS. 1 and 2 lies in that the first dielectric substrate 101 is left in a region corresponding to the three rectangular hole portions 111, 112, 113 and coupling windows 108. The other elements are similar to those of FIGS. 1 and 2, and these elements are attached with the same references to omit explanations.

Although the radio frequency module of Embodiment 1 had air within the waveguide, the present embodiment 2 has a dielectric, in place of air, filled within a waveguide thereof. Because the dielectric is greater in dielectric constant than air, dielectric loss somewhat exists. However, the waveguide overall can be structured in smaller size.

3. Third Exemplary Embodiment

Figure 5:
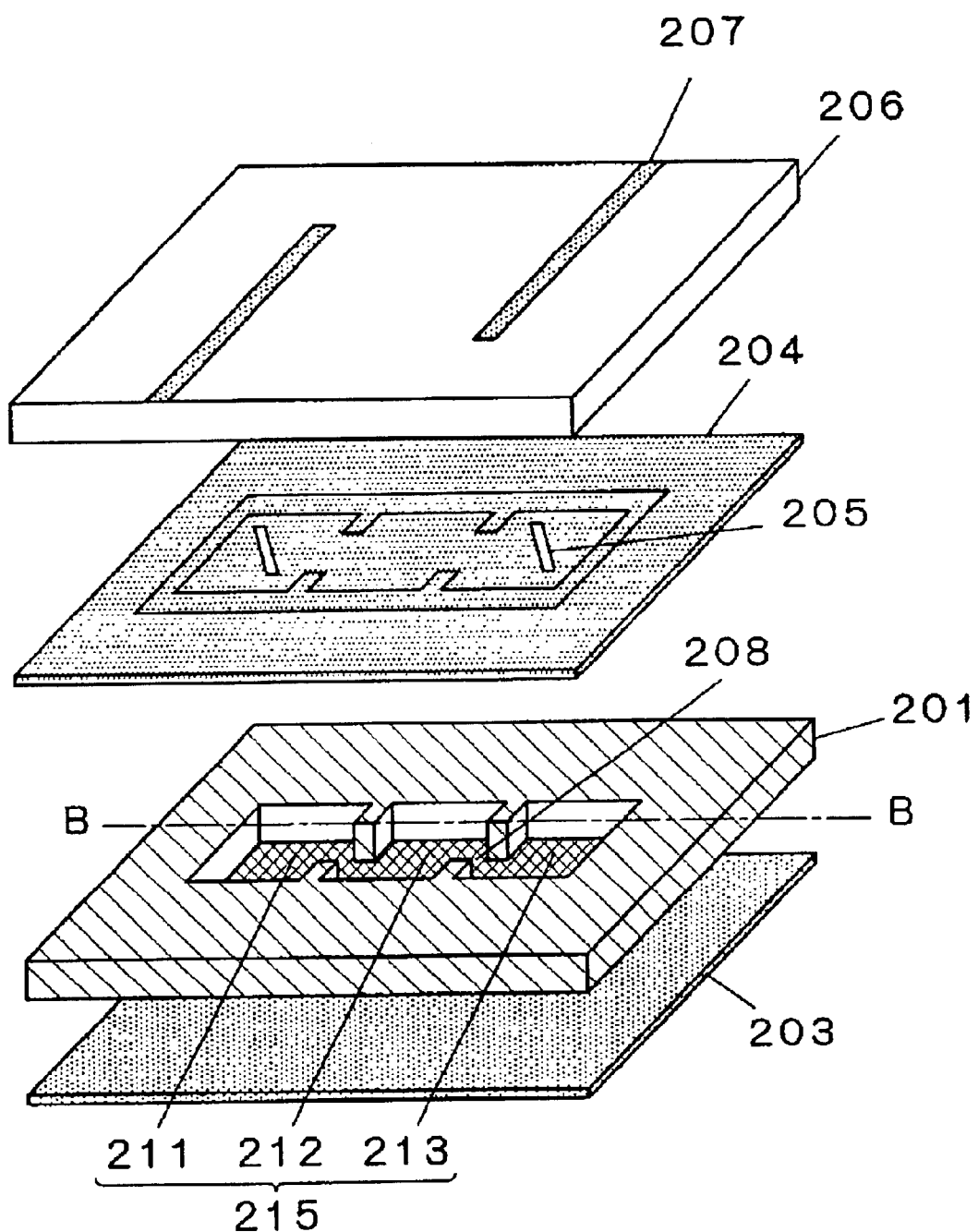
FIG. 5 is an exploded perspective view showing a radio frequency module structure according to Embodiment 3 of the invention.
Figure 5:
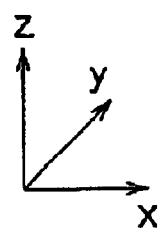
Figure 6:
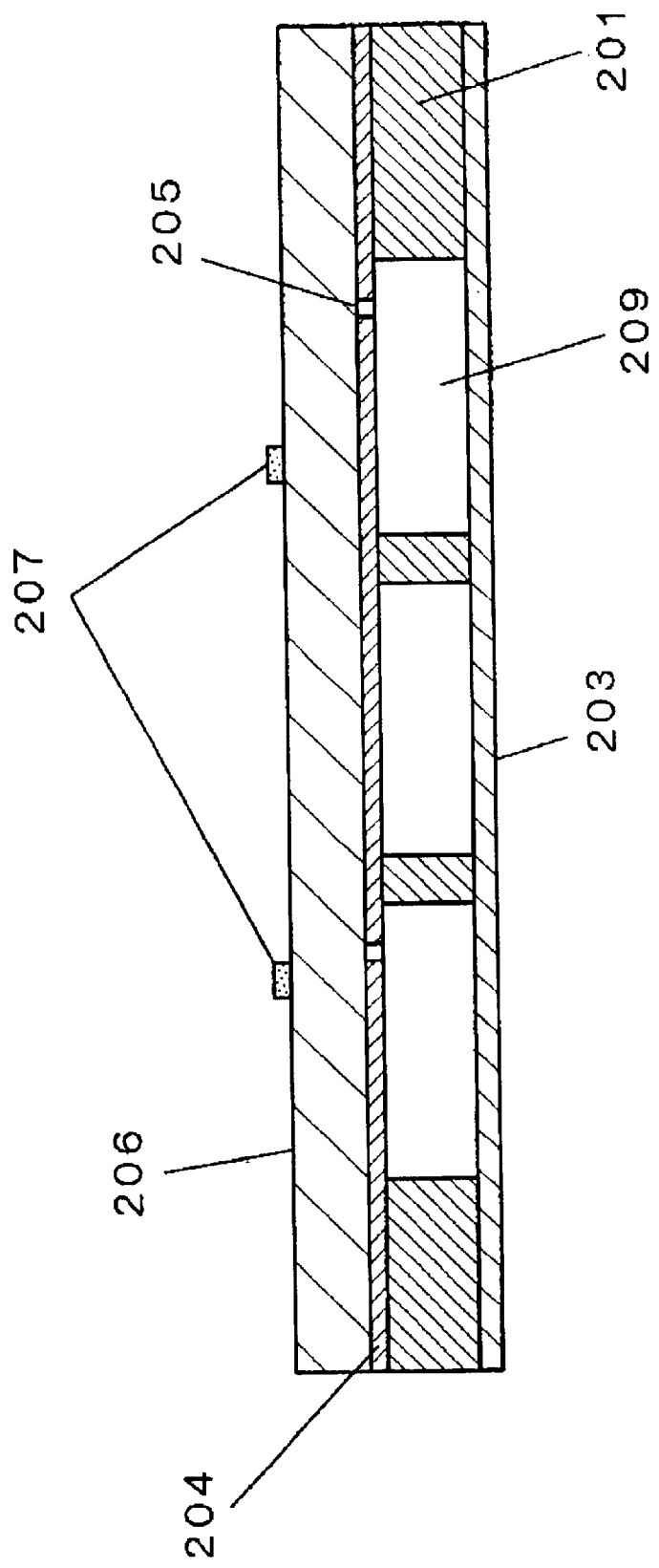
FIG. 6 is a sectional view taken on line B—B in a radio frequency module of FIG. 5.

FIG. 5 is an exploded perspective view showing a three-dimensional structure in a third embodiment of a radio frequency module according to the invention. FIG. 6 is a sectional view taken on line B—B of the radio frequency module of FIG. 5 in a state the elements are bonded together. In FIGS. 5 and 6, the difference from Embodiment 1 lies in that, in order to form a waveguide, used in place of the first dielectric substrate 101 is a copper plate 201 having a penetration hole 215 selectively removed of a material in a region corresponding to the three rectangular hole portions 211, 212, 213 and coupling windows 208 thereof. The copper plate 201 is bonded, on its lower surface, with a copper-make conductor plate 203. On the other hand, on an upper surface of the copper plate 201, bonded is a dielectric substrate 206 formed with a copper-make conductor plate 204 having coupling slots 205. This makes a waveguide that the air in the rectangular hole portions 211, 212, 213 is surrounded by the metal of the copper plate 201.

The penetration hole 215 in the copper plate 201 can be easily formed by a usual wet etching process provided that the plate thickness is 1 mm or its around. Similarly to Embodiment 1, coupling is structurally made to input/output lines 207 through the coupling slots 205.

Incidentally, a dielectric material such as a synthetic resin can be filled in the penetration hole 215 formed in the copper plate 201, similarly to Embodiment 2. In this case, despite there is dielectric loss due to the dielectric material, the entire structure can be made in smaller size.

Although this embodiment used a wet etching process as a process to form a penetration hole 215 in the copper plate 201, it is natural that a drawing or end milling method can be used. Meanwhile, a similar effect is available by a molded resin material plated, on a surface, with a conductor, in place of the copper plate 201.

4. Fourth Exemplary Embodiment

Figure 7:
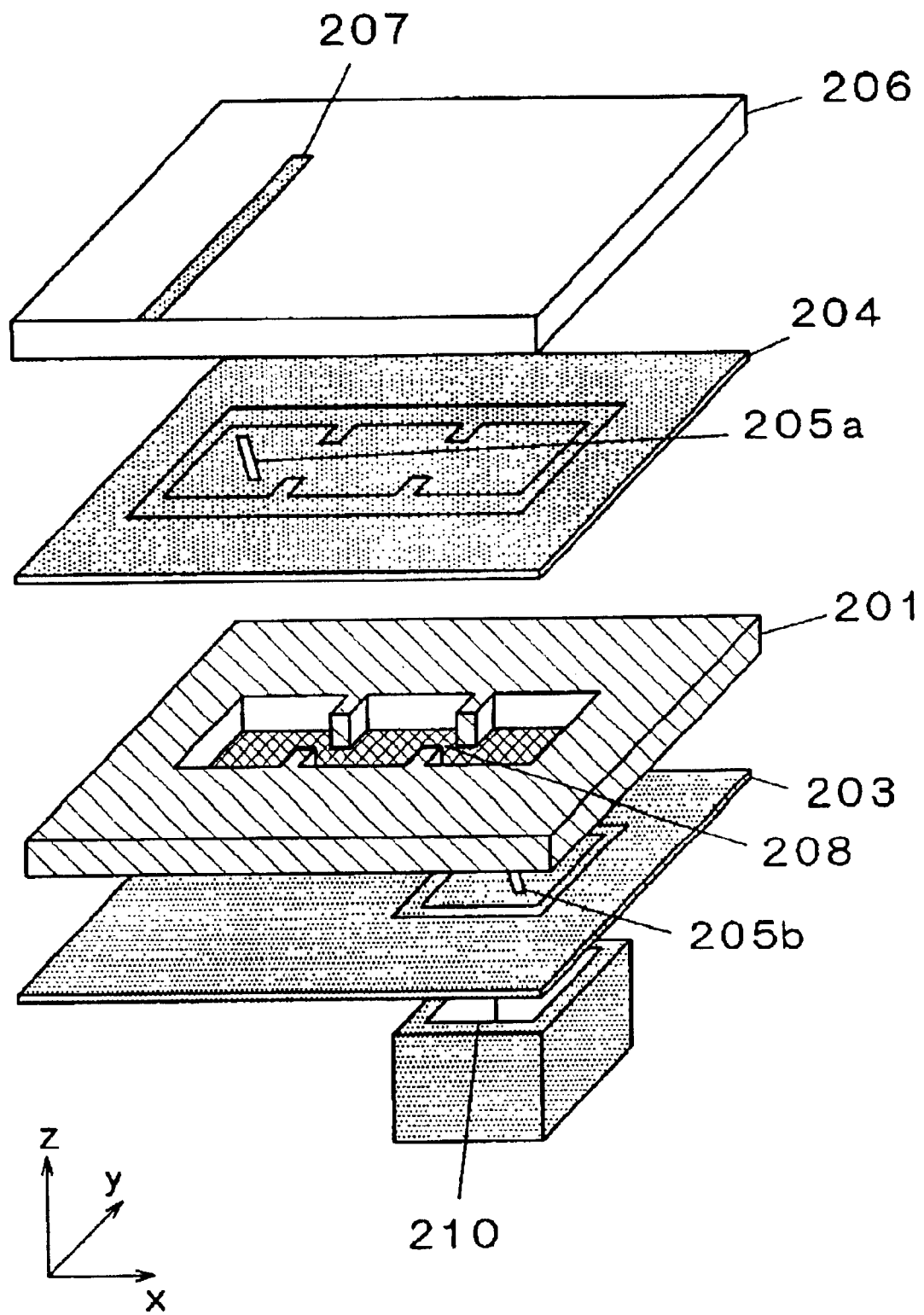
FIG. 7 is an exploded perspective view showing a radio frequency module structure according to Embodiment 4 of the invention.

FIG. 7 is a view showing a three-dimensional structure in a fourth embodiment of a radio frequency module of the invention. In FIG. 7, the difference from FIG. 5 lies in that the input/output coupling slots 205 are separated into two to provide one coupling slot 205a in a conductor plate 204 and the other coupling slot 205b in a conductor plate 203 whereby a rectangular waveguide 210 is coupled to the coupling slot 205b provided in the conductor plate 203. The other structures are similar to those of FIG. 5. With this structure, connection is easy to a device having a waveguide interface, such as an antenna.

Incidentally, in Embodiment 4, the input/output interface was provided, at one end, by a microstrip structure using the input/output line 207 and, at the other end, by the rectangular waveguide 210. However, a similar effect is obtained in case the both are provided as waveguides.

5. Fifth Exemplary Embodiment

Figure 8:
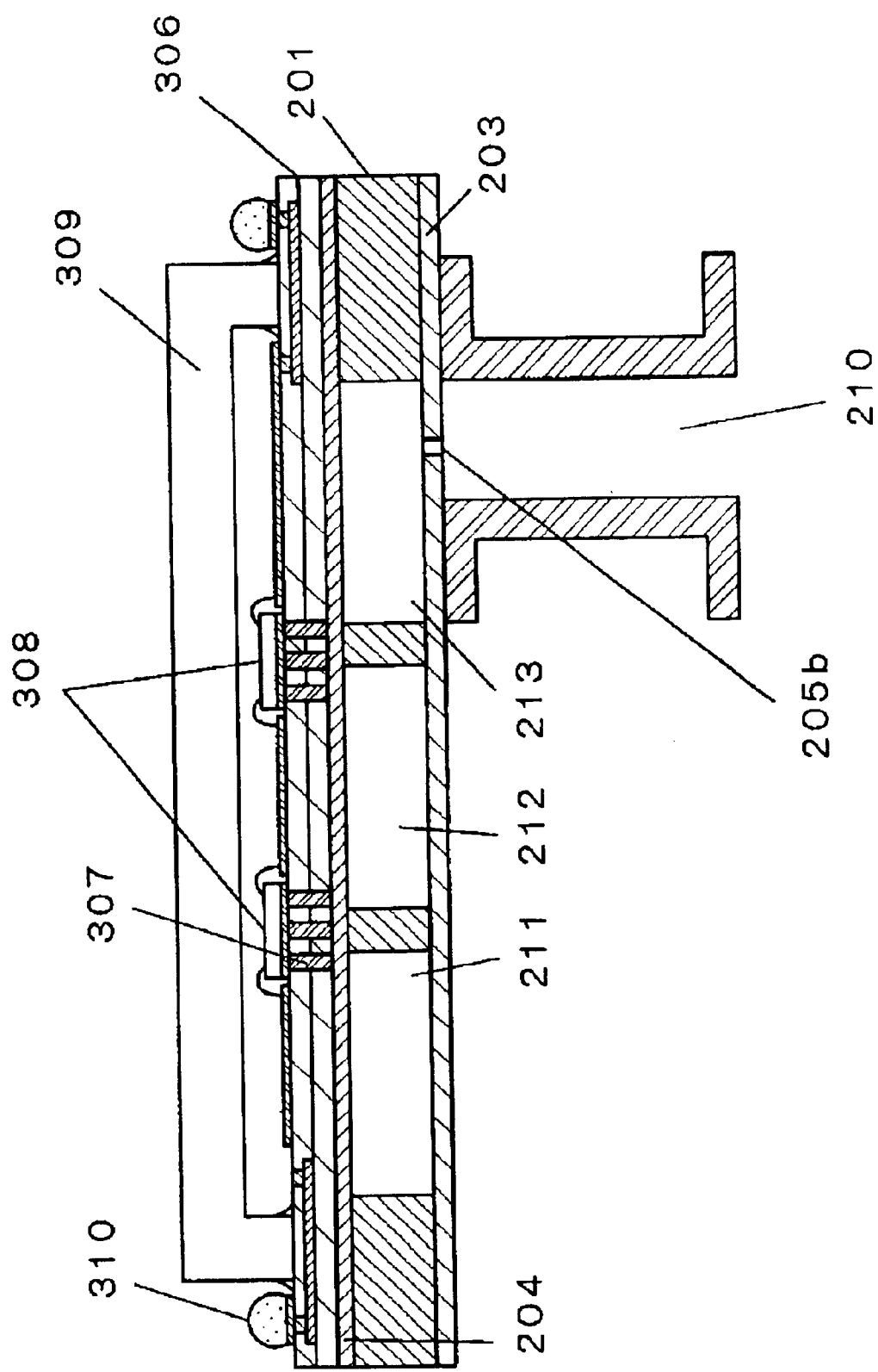
FIG. 8 is a sectional view showing a radio frequency module structure according to Embodiment 5 of the invention.

FIG. 8 is a view showing a sectional structure in a fifth embodiment of a radio frequency module of the invention. In FIG. 8, the difference from FIG. 7 lies in that a dielectric multi-layer film 306 is used in place of the dielectric substrate 206 to provide through-holes 307 buried with conductors whereby integrated circuits (MMICs) 308 are mounted face up on the through-holes 307. A resin cap 309 is fixed around the MMICs 308 to keep airtightness, and electrodes and solder balls 310 are formed in a peripheral region of the film 306 in order for connection to other circuits. The other structures are similar to those of FIG. 7.

The copper plate, used as a material of a rectangular waveguide 210, is excellent in thermal conductivity to serve as a waveguide circuit and for heat dissipation, thus allowing to mount thereon high power MMICs 308.

Incidentally, although Embodiment 5 mounted the MMICs 308 face up, it is needless to say that flip-chip mounting is also applicable. Meanwhile, in order to enhance the low loss and heat dissipation on the waveguide circuit, may be used a conductor of a copper plate or aluminum plate having a thickness of 1 mm or greater worked by machining or die-forming.

6. Sixth Exemplary Embodiment

Figure 9:
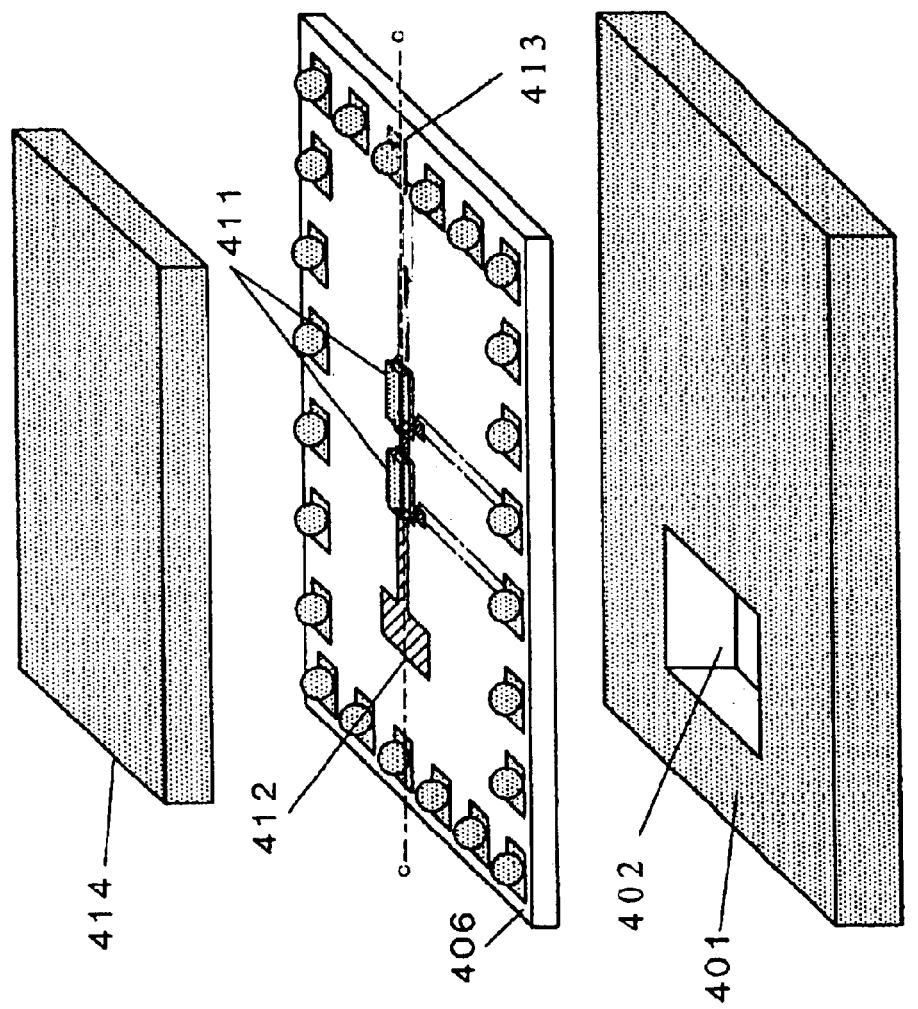
FIG. 9 is an exploded perspective view showing a radio frequency module structure according to Embodiment 6 of the invention.
Figure 10:
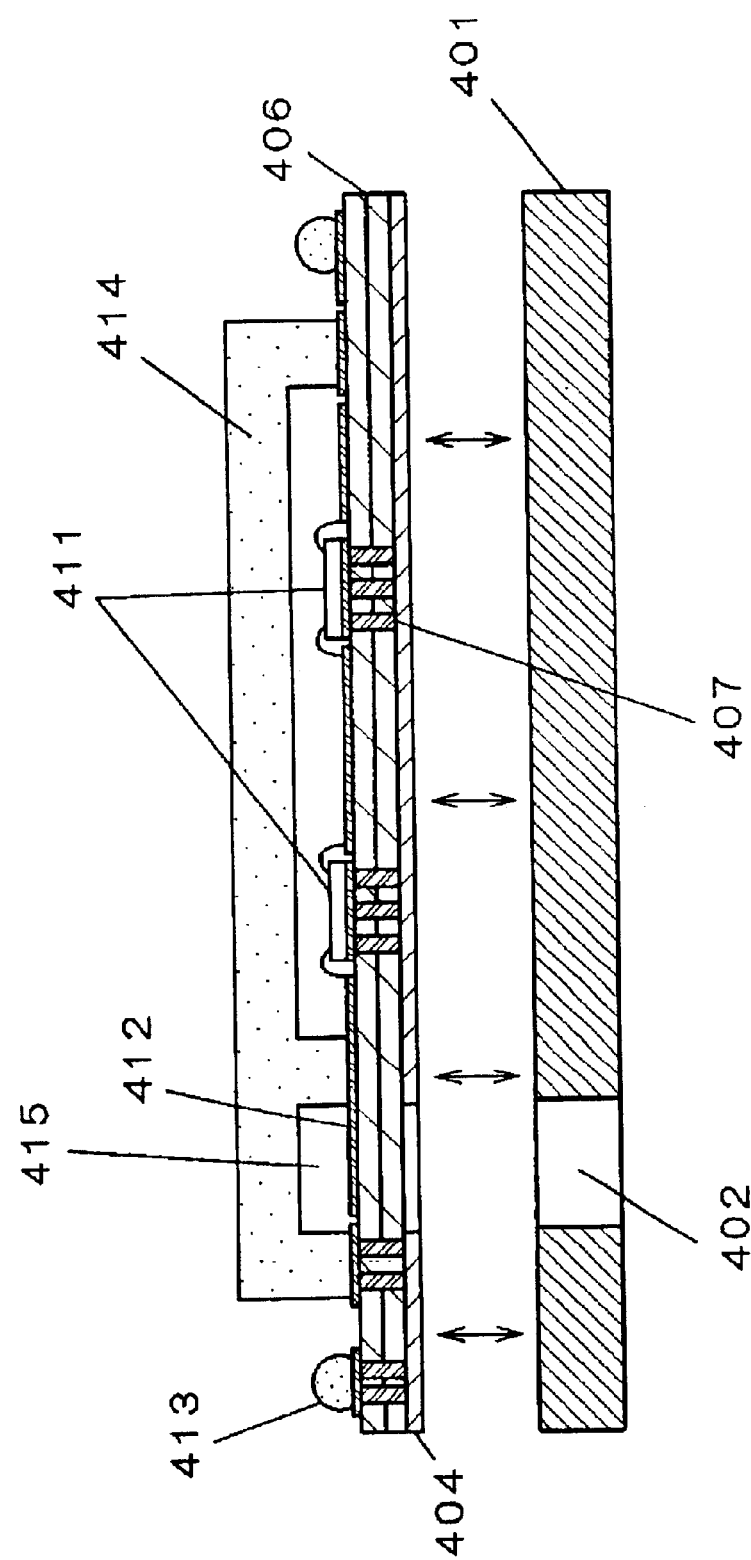
FIG. 10 is a sectional view taken on line C—C in a radio frequency module of FIG. 9.

FIG. 9 is a view showing a three-dimensional structure in a sixth embodiment of a radio frequency module of the invention. FIG. 10 is a view showing a structure in a section C—C in FIG. 9. The present Embodiment 6 employs a suspended structure having a floated circuit formed by bonding a dielectric multi-layer film 406 onto a penetration hole 402 formed in a copper plate 401, thereby forming a monopole antenna 412 realized in loss reduction.

In FIGS. 9 and 10, a penetration hole 402 is formed in the copper plate 401. The dielectric multi-layer film 406 has a structure similar to that of the dielectric multi-layer film 306 of FIG. 8, i.e. formed with conductor-filled through-holes 407, MMICs 411 mounted on the through-holes 407, and electrodes and solder balls 413 in a periphery in order for connection to other circuits. A metal cap 414 is fixed around the MMICs 411 to keep airtightness. The monopole antenna 412 converts a propagation mode over the microstrip line into a propagation mode through a rectangular waveguide. A space 415 formed by hollowing out the metal cap 414 is provided above the monopole antenna 412. The copper plate 401 and the dielectric multi-layer film 406 are bonded together by an adhesive or the like. The signal from the monopole antenna 412 is converted into a waveguide propagation mode through the penetration hole 402.

Although Embodiment 6 explained the example forming, on a suspended structure, a microstrip line and a monopole antenna 412 for waveguide transition, it is needless to say that a filter may be formed.

7. Seventh Exemplary Embodiment

Figure 11:
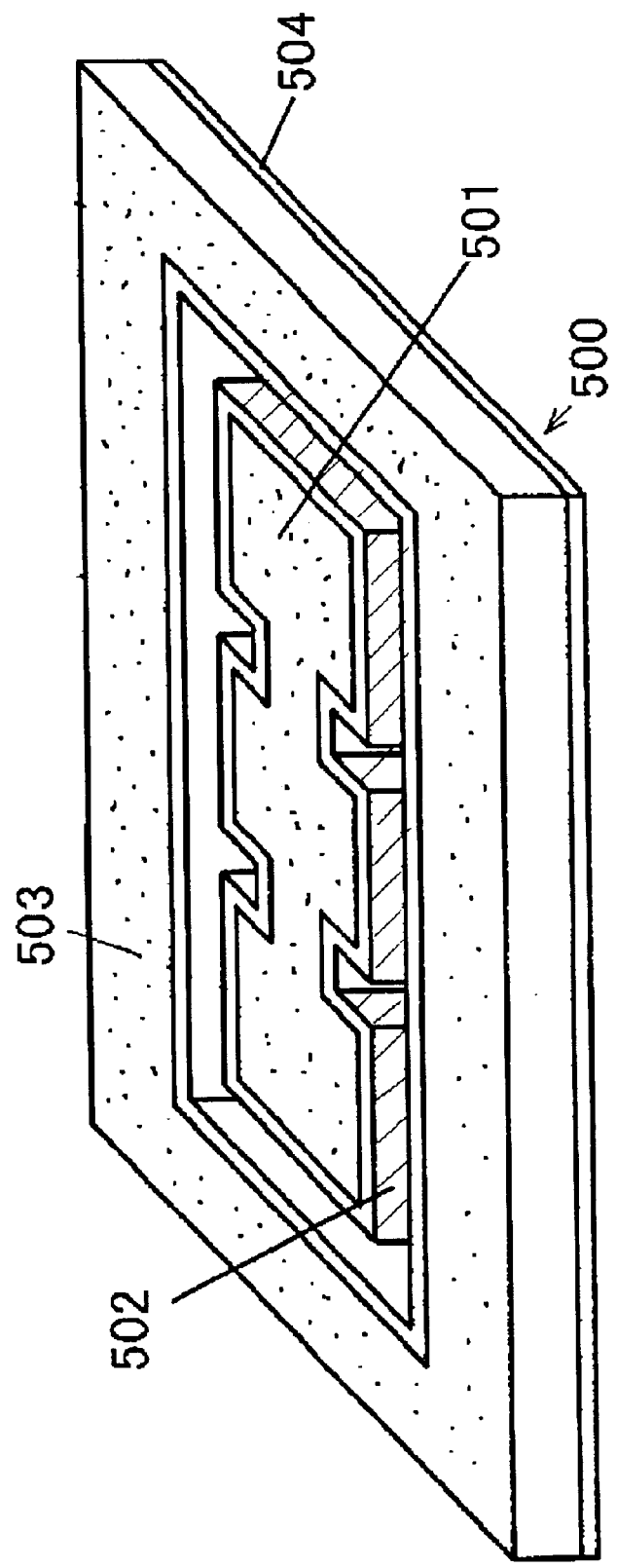
FIG. 11 is a perspective view showing a radio frequency module structure according to Embodiment 7 of the invention.

FIG. 11 is a perspective view showing a dielectric substrate in a seventh embodiment of a radio frequency module of the invention. The present Embodiment 7 is a replacement of the first dielectric substrate 101 of Embodiment 1 to a dielectric substrate structure 500 in the structure of FIG. 11. A metal plating layer 502 is formed on the entire side surface of a dielectric substrate 501 formed in a shape corresponding to the shape of the penetration hole 215 of FIG. 5, around which a synthetic resin frame 503 is formed to a shape similar to the outer periphery of the dielectric substrate 101 of FIG. 1. The synthetic resin frame 503 can be formed by bonding a metal plate 504 to a bottom of the dielectric substrate 501 forming a metal plating layer 502, arranging a rectangular cylindrical frame surrounding an outer side of the dielectric substrate 501 on the metal plate 504, filling a synthetic resin substance to an outer side of and surrounding the dielectric substrate 501, and thereafter removing the rectangular frame. The other structures and operations are similar to those of Embodiment 1, and hence omittedly explained.

Now, explanation is made in detail on a method for manufacturing a radio frequency module explained in Embodiments 1–7, according to Embodiments 8–11.

8. Eighth Exemplary Embodiment

Figure 12:
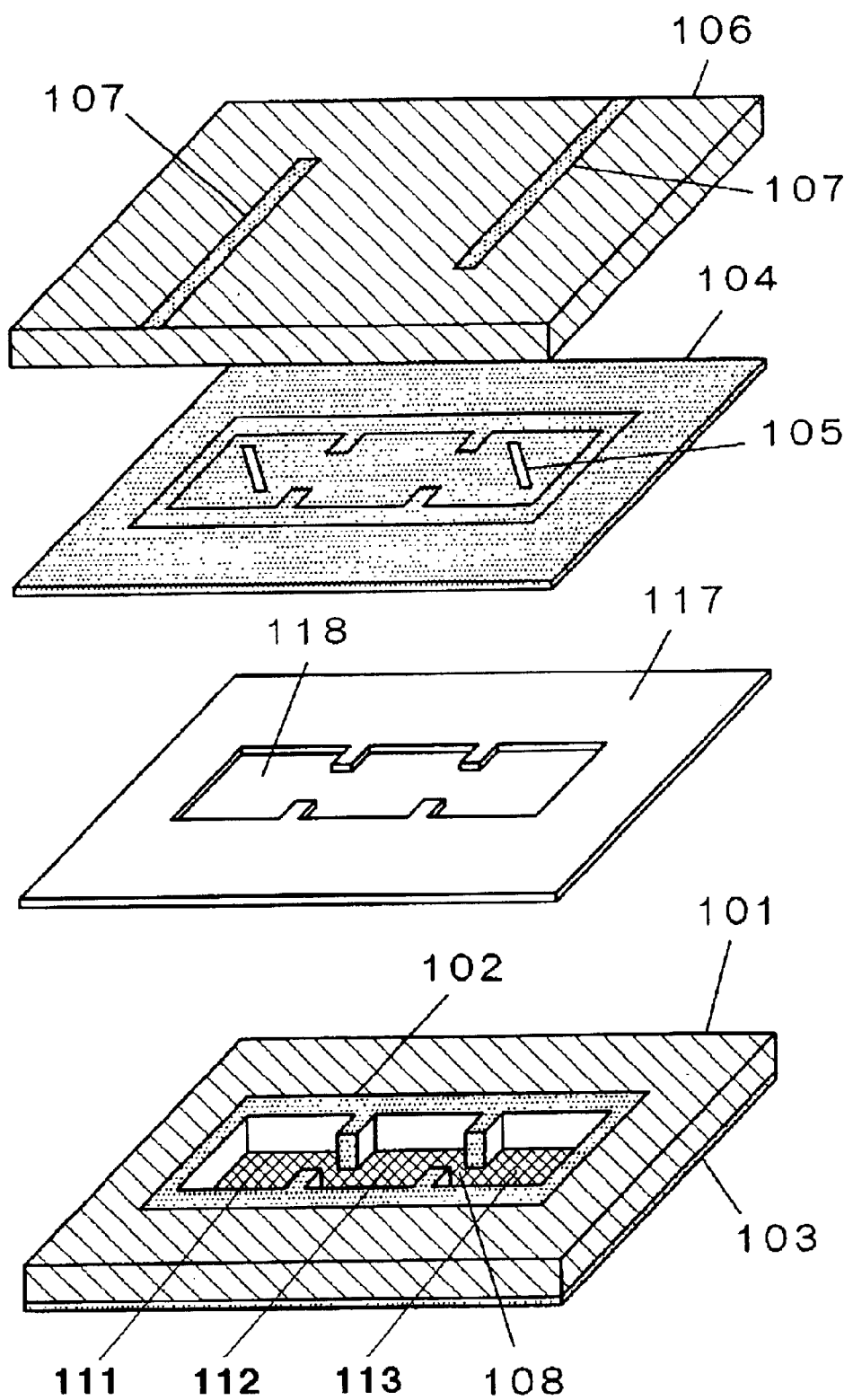
FIG. 12 is a perspective view showing an example of a method for manufacturing a radio frequency module according to Embodiment 8 of the invention.

FIG. 12 shows an embodiment of a method for manufacturing a radio frequency module of Embodiment 1 explained in FIGS. 1 and 2. In FIG. 12, the same elements as those of FIG. 1 are attached with the same references and omittedly explained. The conductive double-sided adhesive sheet 117 is to bond together the first dielectric substrate 101 and the second dielectric substrate 106. This is formed with a blank hole 118 corresponding to the rectangular hole portions 111, 112, 113 and coupling windows 108.

The element parts of the radio frequency module shown in FIG. 12 are to be fabricated as follows. The dielectric substrate 106 can be fabricated, similarly to the general circuit board manufacturing method, by forming resist on the respective surfaces of a resin substrate formed, on both surfaces, with conductor films, such as copper foils, for forming an input/output line 107 and conductor plate 104, and thereafter carrying out patterning by a printer to conduct wet etching on the conductor film, followed by removing the resist.

The conductive double-sided adhesive sheet 117 is commercially available as a material. This can be worked into a desired shape having a blank hole 118 by laser working or die-blanking.

Figure 13A:
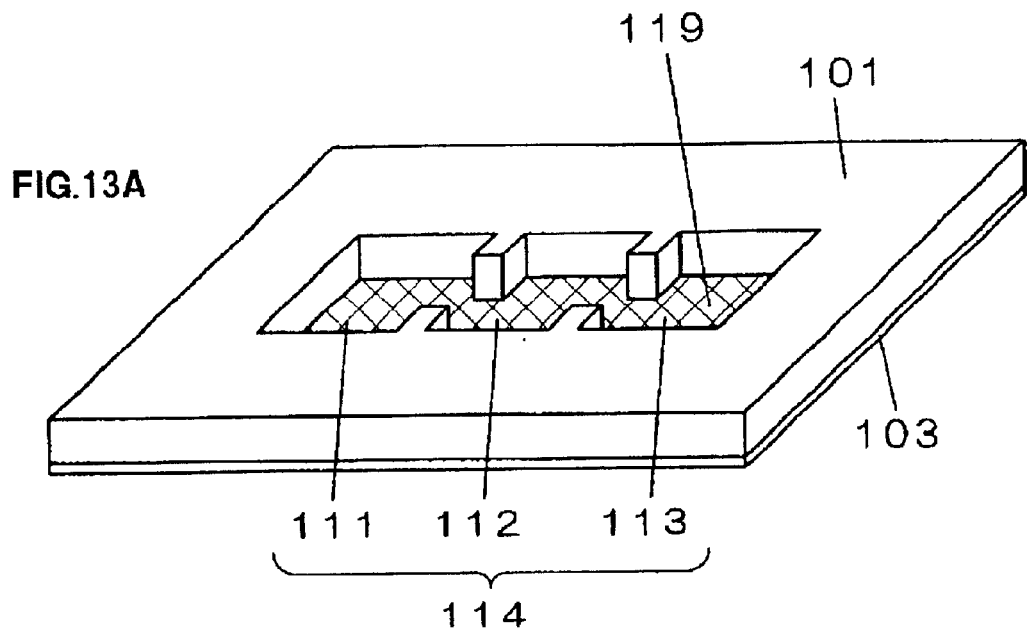
FIG. 13 is a process view showing a manufacturing process of an essential part of the radio frequency module of FIG. 12.
Figure 13B:
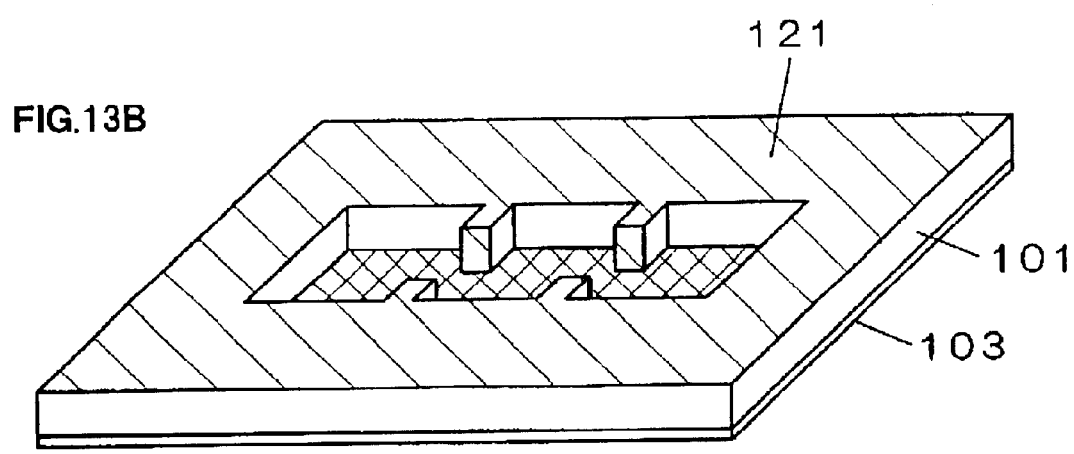
Figure 13C:
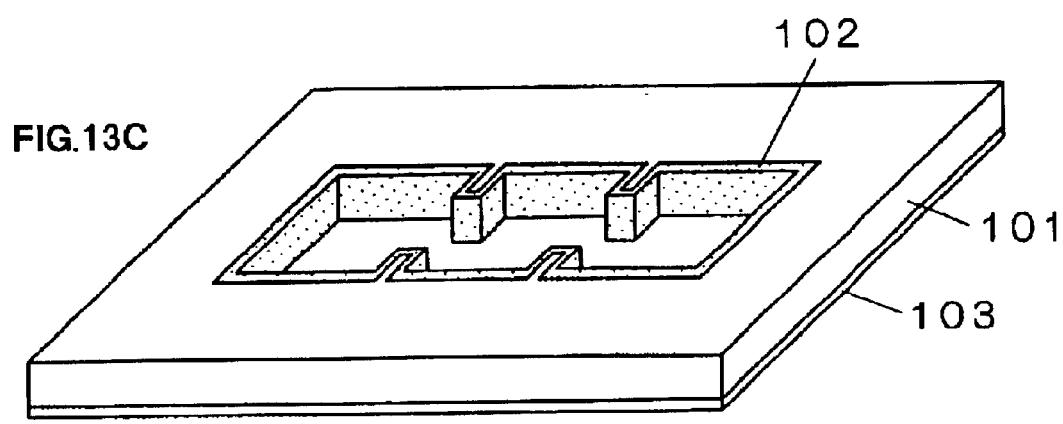

The dielectric substrate 101 can be fabricated by a process shown in FIGS. 13A, 13B and 13C. FIG. 13A shows a process that a penetration hole 114 having three rectangular hole portions 111, 112, 113 has been formed, by laser working, in a dielectric substrate 101 formed with a conductor plate 103 of copper or the like on one surface. The conductor surface 119 shows an exposed surface of the conductor plate 103 by laser-working the dielectric substrate 101.

The kind of a laser usable in the working includes excimer laser and YAG laser, desirably using third or fourth harmonic thereof. This is because such a laser removes the dielectric substrate 101 of resin by ablation instead of thermal working to enable working with less damage to the resin and conductor plate 103. It is possible to use dry etching in working for a penetration hole 114 on the dielectric substrate 101. However, where resin thickness is as great as approximately 200 $\mu$m or more, there is a need to increase the thickness of the resist mask used in etching (nearly equal to or greater than a substrate thickness) and hence the working is not practical.

FIG. 13B shows a process to form, prior to a plating process, a resist mask on the dielectric substrate 101 of after laser worked shown in FIG. 13A. The resist mask 121 is a mask for plating. After resist forming with laminator, a desired pattern is to be obtained by exposure to light and development. After forming a resist mask 121, a surface treatment, called a desmear process, is carried out. Thereafter, by combining electroless plating and electrolytic plating, a conductor layer 102 of a metal film, such as of copper, can be formed on an inner wall of the penetration hole 114. This, together with an exposed area of the conductor plate 103, can constitute a waveguide. The metal film has generally a thickness of approximately 15–50 $\mu$m. FIG. 13C shows a process the resist mask 121 has been removed away after completing the plating process.

A second dielectric substrate 106 is bonded onto the thus fabricated first dielectric substrate 101 through a conductive double-sided adhesive sheet 117 worked with a blank hole 118 in the form of the penetration hole 114 shown in FIG. 12. This can fabricate a radio frequency module.

Incidentally, in the above explanation, the resist mask for plating was formed as in FIG. 13B after laser-working the dielectric substrate 101 shown in FIG. 13A. However, in the case of using a method to form plating resist prior to laser working and remove the resist simultaneously with laser-working the dielectric without performing exposure to light and development, the process can be simplified.

In addition, in a state shown in FIG. 13C, in case a finish process is made by the use of an electric discharge micro-machining apparatus (e.g. MG-ED72W by Matsushita Electric Industrial Co., Ltd) to remove a roughening from a plated surface, loss reduction can be achieved in the waveguide of the radio frequency module. In this case, electric discharge machining is usually conducted in oil. In the invention aiming at removing a roughening in the plated surface, in case electric discharge machining is conducted with a proper amount of abrasive grains mixed in oil, the abrasive grains cause abrasive action on a working surface. This makes possible to finish the working surface with further fineness, enabling to fabricate a radio frequency module reduced in loss.

9. Ninth Exemplary Embodiment

FIG. 14 shows an embodiment on a method for manufacturing a radio frequency module in Embodiment 2 explained in FIGS. 3 and 4.

Figure 14A:
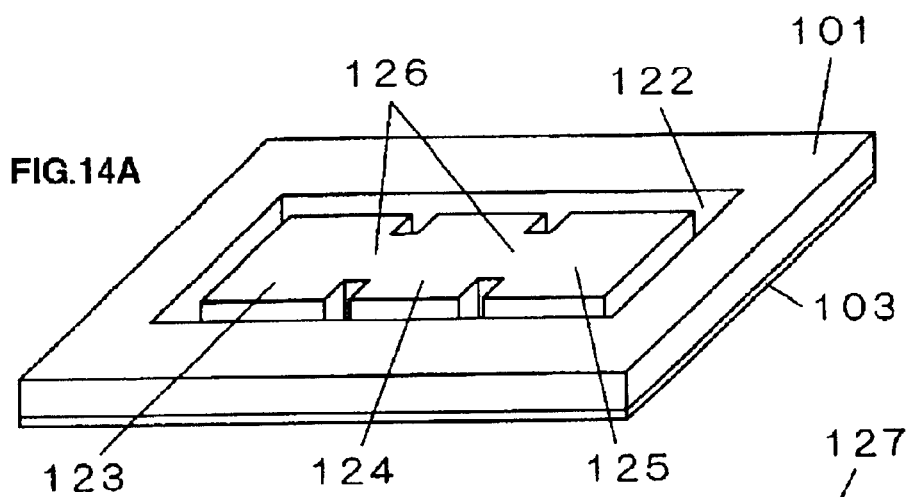
FIG. 14 is a process view showing an example of a manufacturing process for a radio frequency module according to Embodiment 9 of the invention.
Figure 14B:
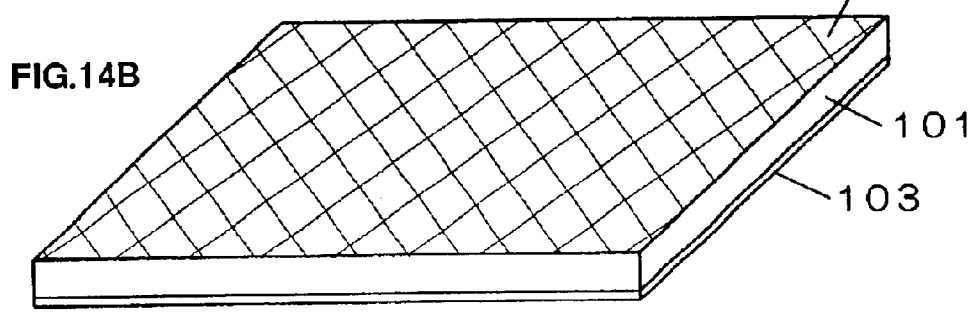

FIG. 14A is a process to carry out groove working by a laser on a dielectric substrate 101 formed with a conductor plate 103 on one main surface thereof. First, a groove 122 is formed in the dielectric substrate 101. The groove 122 is formed leaving portions 123, 124, 125 to be made into a waveguide dielectric and coupling windows 126. In FIG. 14B, a plating film 127 is formed over the entire surface of the dielectric substrate 101 including the groove 122 formed in FIG. 14A. The plating film 127 can be easily obtained by using a commercially available plating liquid and additive. For example, in case a copper-sulfate plating additive (product name: Toppletina) marketed by Okuno Pharmaceutical Industry Co., Ltd. is blended in a copper sulfide solution to carry out electrolytic plating, the groove 122 is buried by copper, thus providing copper plating free of voids.

Incidentally, in case the electrolytic plating uses a plating method, called pulse plating, flowing current intermittently instead of a usual method flowing current to a plating bath, copper burying the groove 122 is favorably formed to provide plating with quality. Meanwhile, after conducting the plating process, in case polishing a surface of the plating film 127, a plating film can be obtained secured with thickness accuracy in the surface.

Figure 14C:
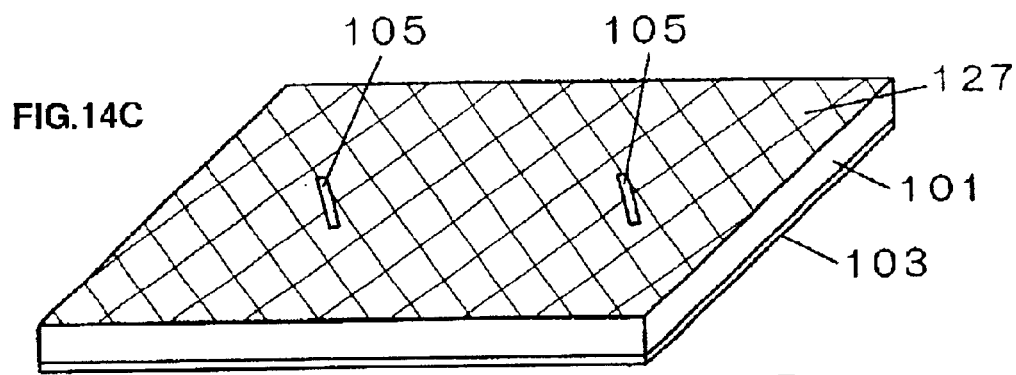

FIG. 14C shows a process to form coupling slots 105 in arbitrary areas of the plating film 127. The coupling slots 105 can be formed by usual wet etching.

Figure 14D:
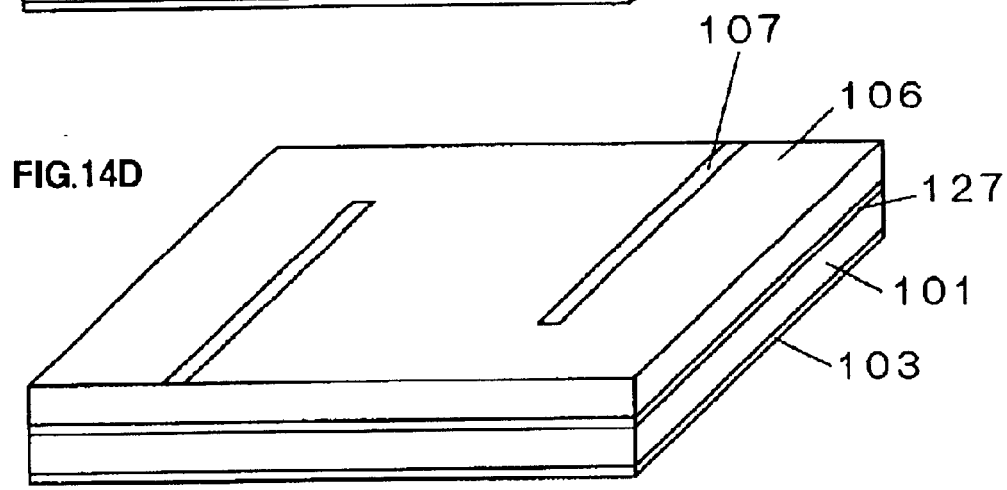

FIG. 14D shows a process to join between the second dielectric substrate 106 (having no conductors at the backside) formed with input/output lines 107 and the first dielectric substrate 101 fabricated by the process of up to FIG. 14C. Although joining is possible by a conductive both-sided adhesive sheet explained in Embodiment 8, this embodiment explains another joining method.

The present Embodiment 9 is characterized in that the first dielectric substrate 101 and the second dielectric substrate 106 use, as a material, liquid crystal polymer that is a thermoplasic resin. Liquid crystal polymer is a material capable of joining, by pressing, not only between liquid crystal polymers but also between liquid crystal polymer and copper. According to an experiment by the present inventor, it has been confirmed that members to be joined can be favorably joined in case the members are heated to 250–350° C. and pressed at a pressure of 10–50 kgf/cm². Incidentally, for favorable joining, it is important to carry out plasma or ozone cleaning on a surface of each member prior to joining between the members.

The use of a radio frequency module manufacturing method according to Embodiment 9 can manufacture a radio frequency module without using a conductive double-sided adhesive sheet. Incidentally, liquid crystal polymer is a material having a favorable radio frequency characteristic, i.e. relative dielectric constant 3.0 and dielectric loss 0.003 as measured in a 10-GHz band. Liquid crystal polymer, because extremely low in dielectric loss, does not cause high loss in a waveguide. The use of the same also allows for structuring a radio frequency module favorable in high-frequency characteristic.

10. Tenth Exemplary Embodiment

Figure 15:
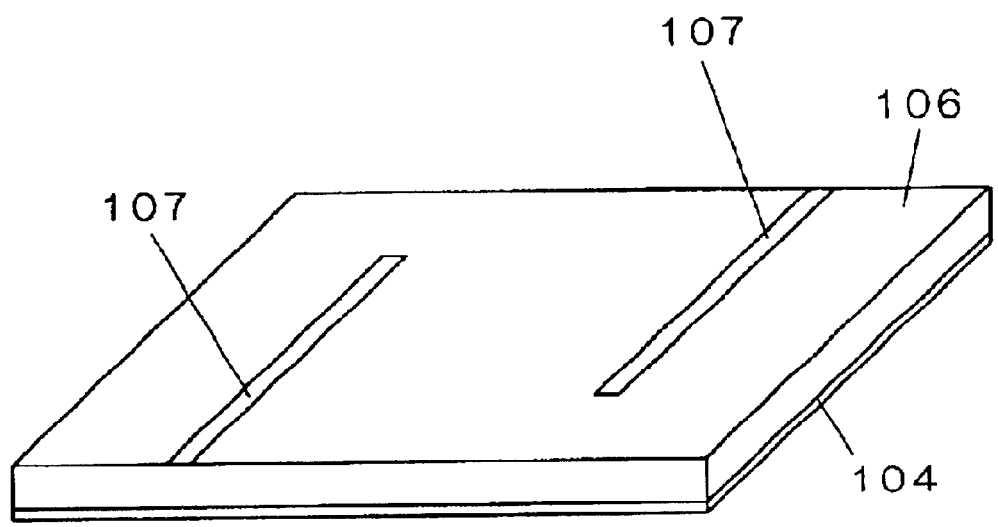
FIG. 15 is an exploded perspective view of a radio frequency module according to Embodiment 10 of the invention.
Figure 15:
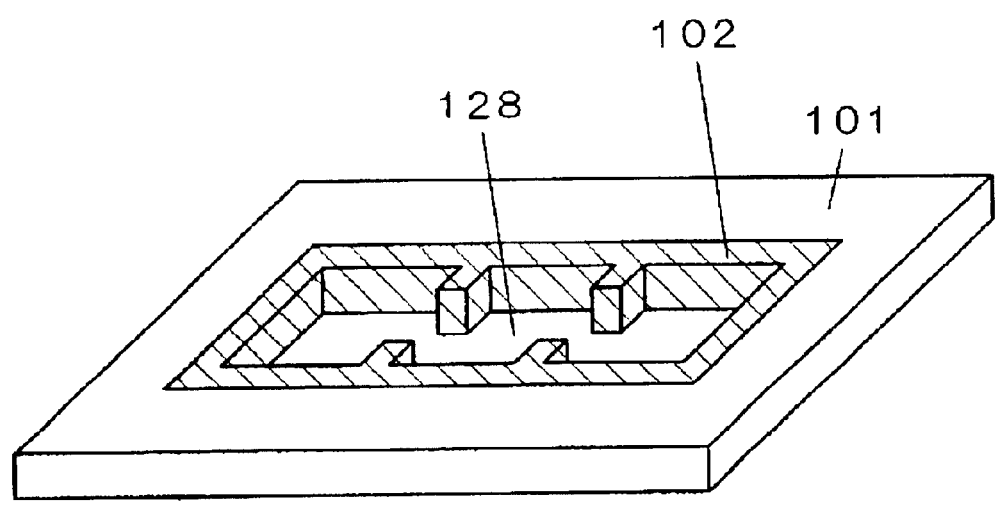
Figure 15:
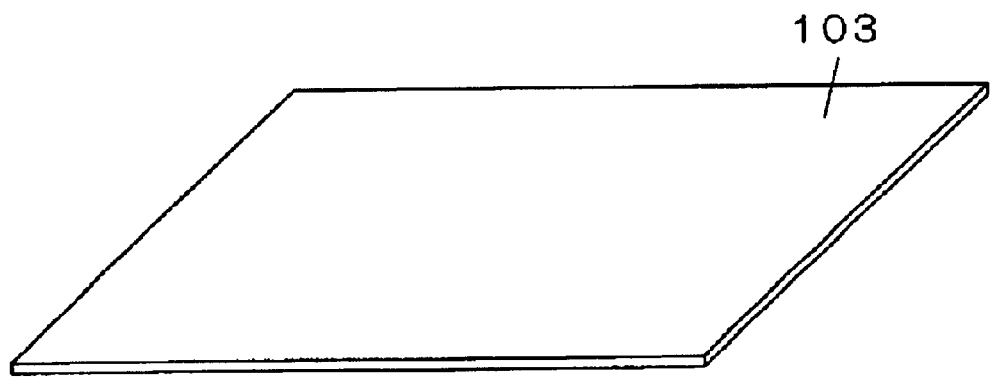

FIGS. 15 and 16 show an embodiment of another method for manufacturing a radio frequency module of Embodiment 1 explained in FIGS. 1 and 2.

FIG. 15 represents a state of members prior to pressing. A dielectric substrate 106, in a material of liquid crystal polymer, is formed with input/output lines 107 in a material of copper on a surface thereof and with a conductor plate 104 in a material of copper on a back surface thereof. Coupling slots 105 are formed on the conductor plate 104. A dielectric substrate 101, in a material of liquid crystal polymer, is formed with a rectangular hole 128 corresponding to the penetration hole 114 of FIG. 13 to be made into a radio frequency module waveguide. Fabricating a rectangular hole 128 is possible by the use of laser working. However, carrying out a molding process is more excellent in respect of production tact and cost. A conductor layer 102 is formed around the rectangular hole 128. The conductor layer 102 can be easily formed by a plating process noted in Embodiment 8.

With the above structure, a radio frequency module can be manufactured by pressing, with applying heat and pressure as explained in Embodiment 9, the second dielectric substrate 106, the first dielectric substrate 101 and the conductor plate 103 formed by a copper foil as a material.

Figure 16A:
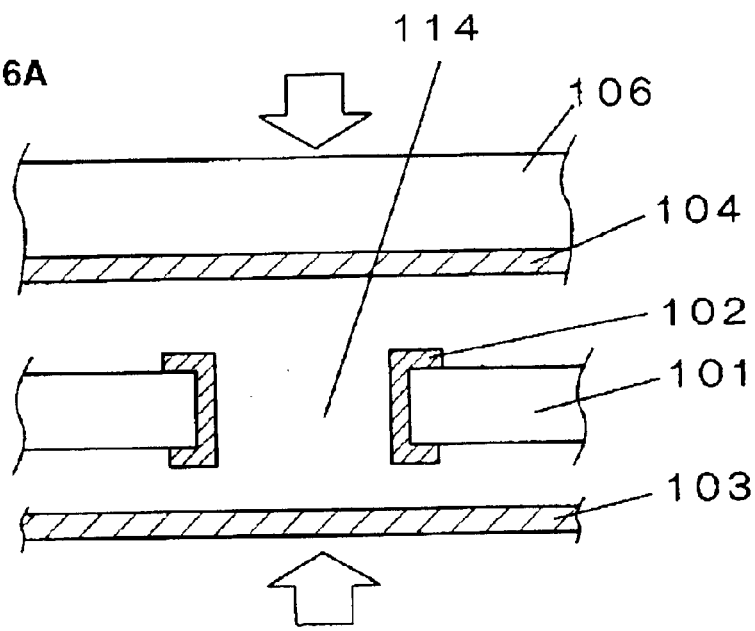
FIG. 16 is a magnified process view of a joining point of between conductor-film metals in a method for manufacturing a radio frequency module according to Embodiment 10 of the invention.
Figure 16B:
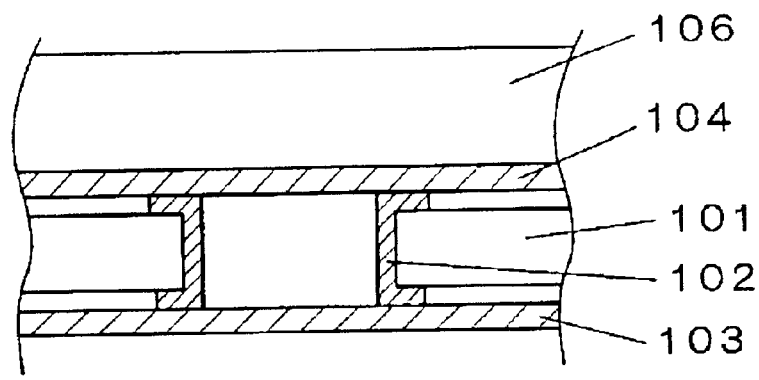
Figure 16C:
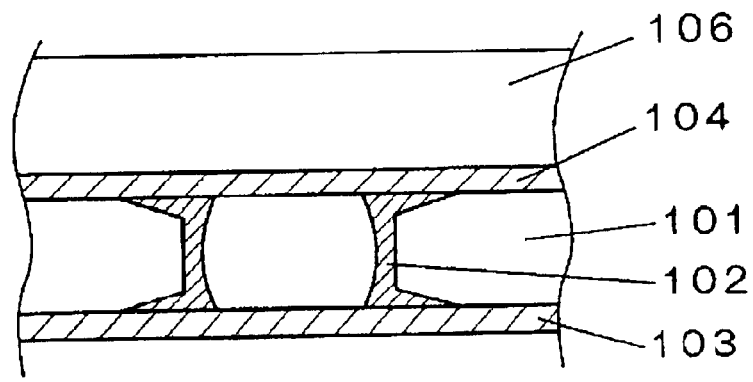

FIG. 16 is a magnifying process view of joining points between the metals, i.e. between the conductor plate 104 and the conductor layer 102 and between the conductor plate 103 and the conductor layer 102. FIG. 16A shows a state prior to joining, FIG. 16B shows at an instant of contact between the metals, and FIG. 16C shows a state joining has been completed.

In FIG. 16A, the conductor layer 102 formed in the penetration hole 114 of the dielectric substrate 101 is in a state covering an inner end of the dielectric substrate 101 sectionally in a squared-U form. As shown in FIG. 16A, the conductor plate 103 and the dielectric substrates 101 and 106 are superposed in this order. When pressure is vertically applied with heating, contacted are the metals of between the conductor plate 104 and the conductor layer 102 and between the conductor plate 103 and the conductor layer 102, as shown in FIG. 16B. In case, in this state, heat and pressure is further applied, the conductor layer 102 deforms as shown in FIG. 16C to realize favorable connection. In order to deform and join the conductor layer 102 in this manner, the plating precipitation in forming a conductor layer 102 is controlled to a certain high rate so that the conductor layer (copper) 102 formed by plating can be made softer than the conductor (copper foil) 103.

Incidentally, FIG. 16C depicts such a form that the conductor layer 102 wedges into the dielectric substrate 101 of liquid crystal polymer as a material. However, because liquid crystal polymer is a thermoplastic resin, it at a temperature of 250–350° C. is in a state softer than the conductor film 102. Accordingly, the form shown in FIG. 16C can be readily achieved even by increasing the plating rate onto the conductor layer 102 to soften the conductor layer 102.

11. Eleventh Exemplary Embodiment

Figure 17:
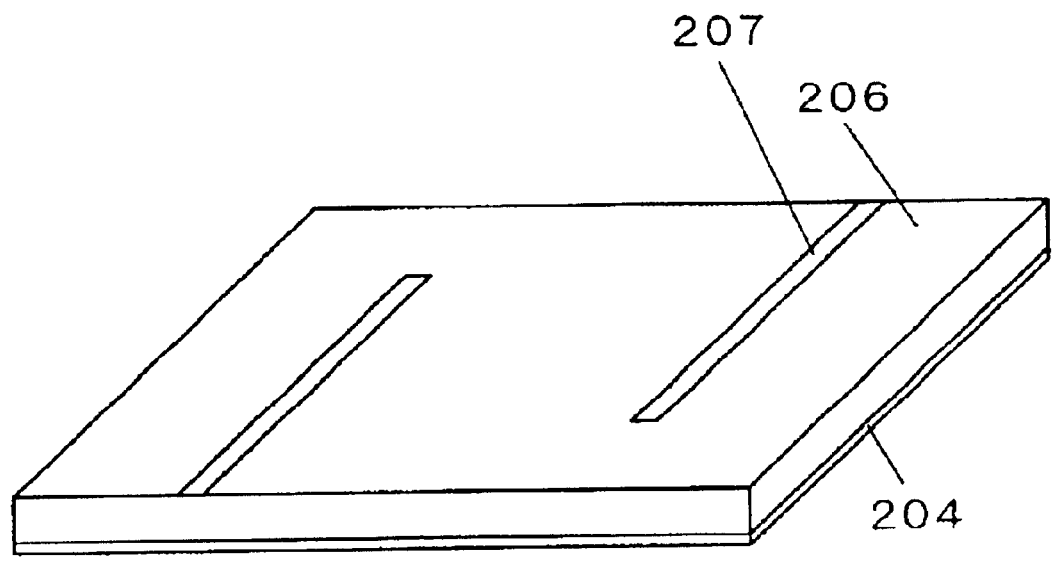
FIG. 17 is a perspective view for explaining a process in a manufacturing method for a radio frequency module according to Embodiment 11 of the invention.
Figure 17:
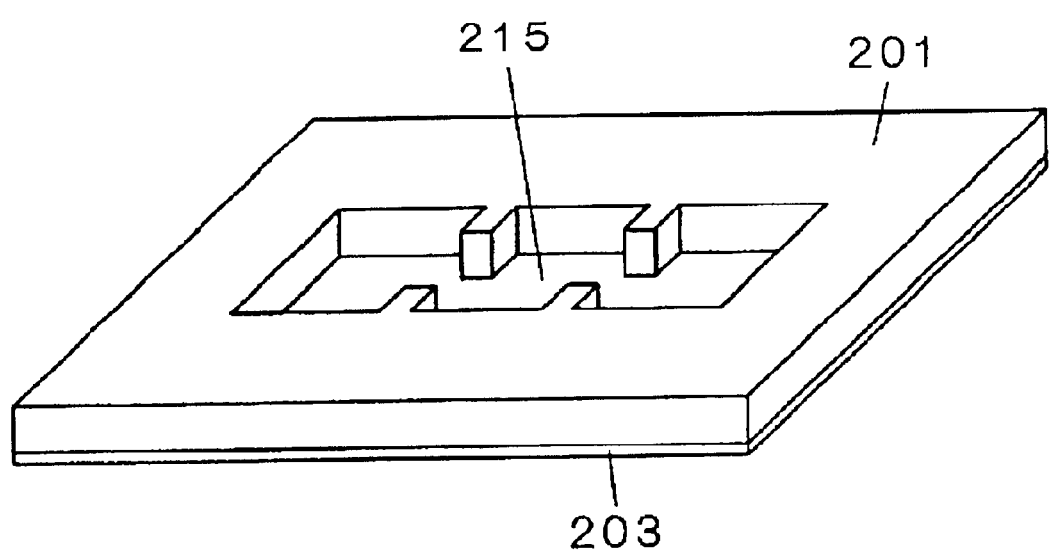

FIG. 17 shows an embodiment on a method for manufacturing a radio frequency module in Embodiment 3 explained in FIGS. 5 and 6.

In FIG. 17, the same elements as those of FIG. 5 are attached with the same references to omit explanations. The penetration hole 215 in a copper plate 201 can be formed by general-purpose machining or wet etching on the copper. The conductor plate 203 on the copper plate 201 is previously joined to the copper plate 201 but may be joined after forming a penetration hole 215 in the copper plate 201. Although joining between the dielectric substrate 206 and the copper plate 201 can be achieved by the use of a conductive double-sided adhesive sheet explained in Embodiment 8, the present Embodiment 11 explains a joining method not relying upon a conductive double-sided adhesive sheet.

Figure 18:
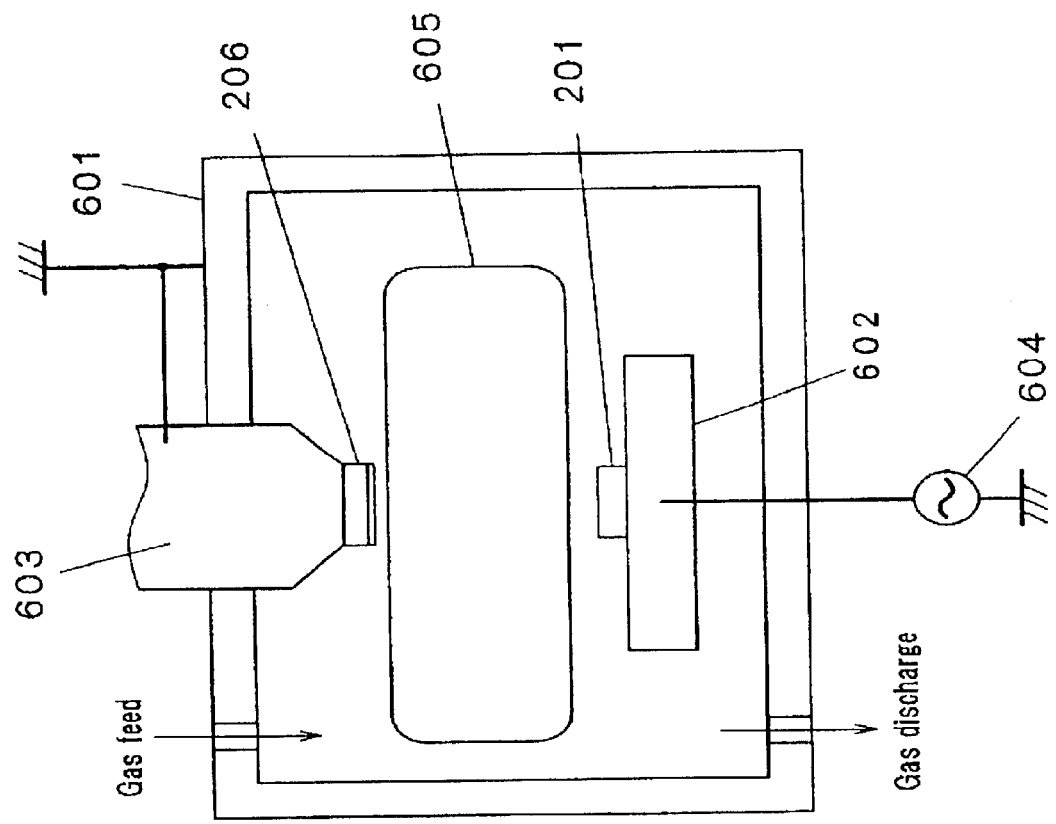
FIG. 18 is a concept view for explaining a joining method according to Embodiment 11 of the invention.

FIG. 18 is a concept view of a joining device for implementing the joining method in this embodiment. The copper plate 201 and the dielectric substrate 206 are those as explained in FIG. 17. Within a vacuum chamber 601, there are installed a heater stage 602 to place thereon a copper plate 201 and a chuck 603 with heater to absorbingly hold a dielectric substrate 206. The chuck 603 with heater is structured for vertically ascending/descending and applying pressure within the vacuum chamber 601. The heater stage 602 is connected with a radio frequency power supply 604 including a rectifier circuit, to be supplied with a radio frequency (e.g. 13.56 MHz).

With this device, inert gas such as argon, nitrogen gas or oxygen gas is introduced in the vacuum chamber 601 to regulate a gas discharge amount of within the vacuum chamber 601. In case a radio frequency is applied to the heater stage 602 in a state the vacuum chamber 601 is under arbitrary low pressure, a plasma 605 is caused at between the copper plate 201 and the dielectric substrate 206. The plasma 605 exhibits an effect to clean a surface of the copper plate 201 and dielectric substrate 206. After this process, the heater stage 602 and chuck 603 are heated up and the chuck 603 is descended to urge the dielectric substrate 206 on the copper plate 201. This causes direct joining at between the coppers of the copper plate 201 and the copper-make metal plate 204 of the dielectric substrate 206.

According to an experiment by the present inventor, when argon, nitrogen or oxygen gas has been used to apply a radio frequency of 300 mW (13.56 MHz) at a gas flow rate of 50 sccm under a low pressure of 40 Pa thereby causing a plasma for 1 minutes, and thereafter the heater stage 602 and chuck 603 have raised in temperature to 150° C. to cause joining under a condition of 150 kgf/cm², then coppers have been directly joined favorably. With this method, direct joining is possible at lower temperature than the joining method explained in Embodiments 9 and 10.

With this joining method, by ceasing the gas supply after causing a plasma 605 and increasing the vacuum within the vacuum chamber 601 to directly join the copper plate 201 and the dielectric substrate 206 together, a radio frequency module can be manufactured having a waveguide space thereof kept in a vacuum state. In a vacuum state in a space within the radio frequency module, there is no fear, for a long term, to cause oxidation in a waveguide wall of the radio frequency module, thus securing reliability for the radio frequency module over a long term.

Meanwhile, with using this method, besides a vacuum state in the waveguide space, the waveguide can be filled with nitrogen or inert gas by introducing nitrogen or inert gas to the vacuum chamber 601 after evacuating the vacuum chamber 601. Thus, the radio frequency module can be kept with reliability over a long term, similarly to the case of in vacuum state.

Although, in the above explanation, the copper plate 201 and dielectric substrate 206 were cleaned in the surface by the plasma 605, a similar effect is to be achieved by the use of an atom or ion beam.

According to Embodiment 11, a radio frequency module can be directly manufactured at a temperature of 200° C. or lower. Also, it is possible to manufacture a radio frequency module having high reliability over a long term.

What is claimed is:

1. A radio frequency module comprising:
   a dielectric substrate having first and second main surfaces and a rectangular penetration hole opening in the first and second main surfaces, the penetration hole includes a plurailty of hole portions juxtaposed at intervals to each other;
   first and second conductors for grounding being provided on the first and second main surfaces to cover the openings of the penetration hole; and
   a conductor layer formed on opposite wall surfaces of the penetration hole in the dielectric substrate;
   wherein a waveguide structure is formed by a space surrounded by the first and second conductors and the conductor layer.

2. A radio frequency module according to claim 1, wherein air exists in the space surrounded by the first and second conductors and the conductor layer.

3. A radio frequency module according to claim 1, wherein a vacuum is given or an inert or nitrogen gas is filled in the space surrounded by the first and second conductors and the conductor layer.

4. A radio frequency module according to claim 1, wherein the penetration hole includes the plurality of hole portions juxtaposed at constant intervals to each other, and thereby structuring the space surrounded by the first and second conductors and the conductor layer.

5. A radio frequency module according to claim 1, further comprising a slot provided in the first conductor in a region immediately above the penetration hole provided in the dielectric substrate, another dielectric substrate superposed on the first conductor, and an input/output microstrip line provided on the other dielectric substrate in a position where an electromagnetic coupling is to be obtained with the slot.

6. A radio frequency module according to claim 1, further comprising a filter circuit, having cavity resonators coupled in plurality, formed by the waveguide structure in the dielectric substrate.

7. A radio frequency module according to claim 1, further comprising slots in both the first and second conductors, the slot provided in the first conductor being coupled with a microstrip line and the slot provided in the second conductor being coupled with a waveguide other than the waveguide structure.

8. A radio frequency module comprising:
   a metal plate having a penetration hole;
   first and second conductors for grounding being provided on first and second main surfaces of the metal plate; and
   a dielectric substrate using a multi-layer dielectric film, a buried through-hole provided in an arbitrary position of the dielectric film, an integrated circuit mounted on the buried through-hole, and an electrode, a bump and a sealing cap are mounted on the dielectric substrate,
   wherein a waveguide structure is formed by a space surrounded by the first and second conductors for grounding and a wall surface of the penetration hole.

9. A radio frequency module comprising:
   a copper plate having a penetration hole in an arbitrary position and a multi-layer dielectric film;
   a buried through-hole provided in an arbitrary position of the dielectric film;
   an integrated circuit mounted on the buried through-hole;
   an antenna or filter circuit formed above the penetration hole; and
   a metal cap mounted over said integrated circuit and said antenna or filter circuit.

* * * * *